(12) United States Patent
Yu et al.

(10) Patent No.: US 10,950,554 B2
(45) Date of Patent: Mar. 16, 2021

(54) SEMICONDUCTOR PACKAGES WITH ELECTROMAGNETIC INTERFERENCE SHIELDING LAYER AND METHODS OF FORMING THE SAME

(71) Applicant: Taiwan Semiconductor Manufacturing Co., Ltd., Hsinchu (TW)

(72) Inventors: Chen-Hua Yu, Hsinchu (TW); Kuo-Chung Yee, Taoyuan (TW); Chun-Hui Yu, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/035,711

(22) Filed: Jul. 16, 2018

(65) Prior Publication Data
US 2020/0020643 A1    Jan. 16, 2020

(51) Int. Cl.
*H01L 23/552*    (2006.01)
*H01L 25/065*    (2006.01)
*H01L 23/31*     (2006.01)
*H01L 23/498*    (2006.01)
*H01L 23/00*     (2006.01)
*H01L 25/00*     (2006.01)
*H01L 21/56*     (2006.01)

(52) U.S. Cl.
CPC .......... *H01L 23/552* (2013.01); *H01L 21/563* (2013.01); *H01L 23/3128* (2013.01); *H01L 23/49822* (2013.01); *H01L 23/49827* (2013.01); *H01L 24/32* (2013.01); *H01L 25/0652* (2013.01); *H01L 25/50* (2013.01); *H01L 24/16* (2013.01); *H01L 2224/16227* (2013.01); *H01L 2224/32225* (2013.01)

(58) Field of Classification Search
CPC ............ H01L 23/552; H01L 23/49827; H01L 23/49822; H01L 23/3128; H01L 25/50; H01L 25/0652; H01L 2224/16227; H01L 2224/32225; H01L 24/32; H01L 24/16; H01L 21/563; H01L 23/60; H01L 23/66; H01L 24/26
See application file for complete search history.

(56) References Cited

U.S. PATENT DOCUMENTS

| | | |
|---|---|---|
| 8,420,437 B1 * | 4/2013 | Fan ...................... H01L 23/552 257/419 |
| 8,993,380 B2 | 3/2015 | Hou et al. |
| 9,000,584 B2 | 4/2015 | Lin et al. |
| 9,048,222 B2 | 6/2015 | Hung et al. |
| 9,048,233 B2 | 6/2015 | Wu et al. |

(Continued)

*Primary Examiner* — Kenneth Parker
*Assistant Examiner* — Scott E Bauman
(74) *Attorney, Agent, or Firm* — JCIPRNET

(57) ABSTRACT

Semiconductor packages and methods of forming the same are provided. a semiconductor package includes a sub-package, a second die and a second molding layer. The sub-package includes a first die, a first molding layer aside the first die and a first redistribution layer structure disposed over the first die and the first molding layer and electrically connected to the first die. The second die is disposed over the sub-package, wherein the first die and the second die are disposed on opposite surfaces of the first redistribution layer structure. The second molding layer encapsulates the sub-package and the second die.

20 Claims, 8 Drawing Sheets

(56) References Cited

U.S. PATENT DOCUMENTS

| | | | |
|---|---|---|---|
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,299,649 B2 | 3/2016 | Chiu et al. | |
| 9,368,460 B2 | 6/2016 | Yu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 10,074,615 B1* | 9/2018 | Tseng | H01L 21/0201 |
| 10,510,679 B2* | 12/2019 | Wang | H01L 21/561 |
| 2009/0302439 A1* | 12/2009 | Pagaila | H01L 23/29 257/660 |
| 2011/0298101 A1* | 12/2011 | Pagaila | H01L 21/561 257/659 |
| 2012/0139097 A1* | 6/2012 | Jin | H01L 21/561 257/712 |
| 2013/0075923 A1* | 3/2013 | Park | H01L 25/0652 257/774 |
| 2016/0148904 A1* | 5/2016 | Zhai | H01L 21/4853 257/777 |
| 2016/0307872 A1* | 10/2016 | Chen | H01L 21/4857 |
| 2016/0315071 A1* | 10/2016 | Zhai | H01L 23/3128 |
| 2016/0351509 A1* | 12/2016 | Dang | H01L 23/552 |
| 2017/0012007 A1* | 1/2017 | Chung | H01L 23/60 |
| 2017/0098629 A1* | 4/2017 | Liu | H01L 24/20 |
| 2017/0290207 A1* | 10/2017 | Smith | H05K 9/0024 |
| 2018/0138155 A1* | 5/2018 | Kim | H01L 23/552 |
| 2019/0006288 A1* | 1/2019 | Wang | H01L 23/552 |
| 2019/0051614 A1* | 2/2019 | Dimaano Jr. | H01L 23/3128 |
| 2019/0096699 A1* | 3/2019 | Chiang | H01L 24/97 |
| 2019/0189599 A1* | 6/2019 | Baloglu | H01L 23/3736 |
| 2019/0348371 A1* | 11/2019 | Fang | H01L 25/0655 |

* cited by examiner

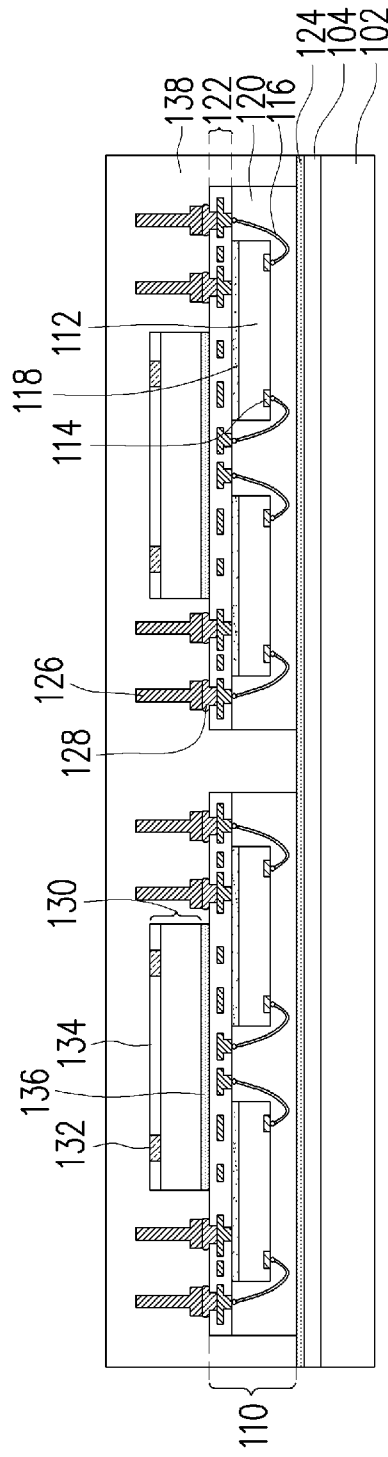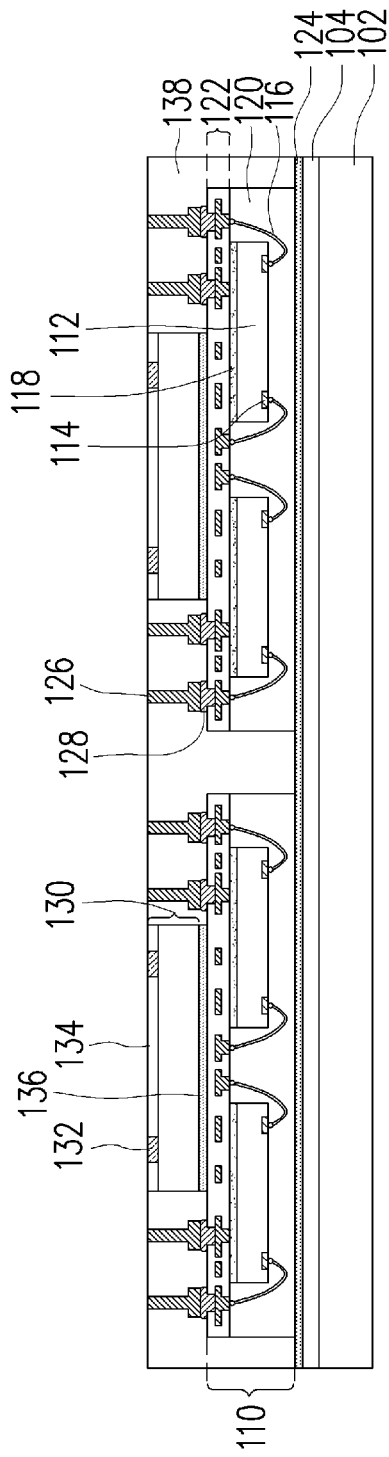

SEMICONDUCTOR PACKAGES WITH ELECTROMAGNETIC INTERFERENCE SHIELDING LAYER AND METHODS OF FORMING THE SAME

BACKGROUND

Developments of the three-dimensional integration technology for wafer level packaging are underway to satisfy the demands of size reduction, high performance interconnects and heterogeneous integration for high-density integration packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A through FIG. 1H are schematic cross sectional views of various stages in a method of forming a semiconductor package in accordance with some embodiments.

DETAILED DESCRIPTION

Figure 1A:
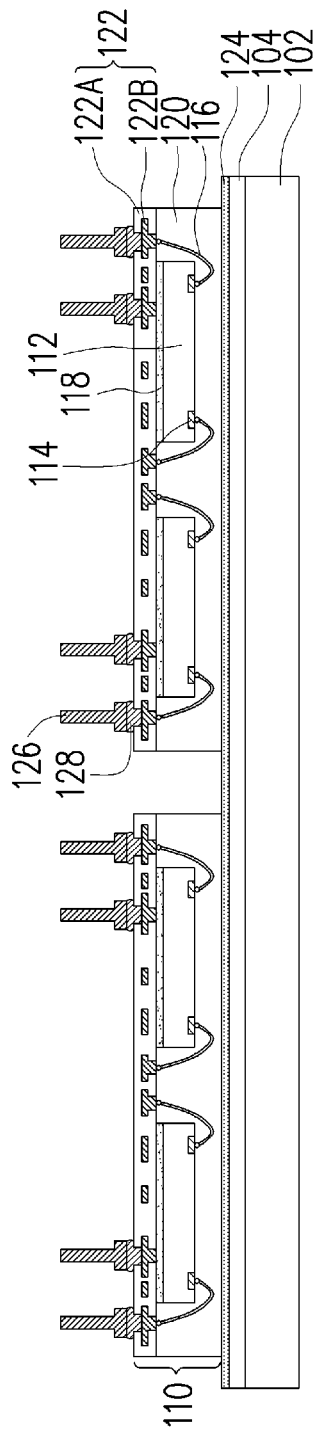

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer structure or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A through FIG. 1H are schematic cross sectional views of various stages in a method of forming a semiconductor package in accordance with some embodiments. In exemplary embodiments, the semiconductor manufacturing method is part of a packaging process. In some embodiments, two chips or dies are shown to represent plural chips or dies of the wafer.

Referring to FIG. 1A, in some embodiments, a carrier 102 with a buffer layer 104 coated thereon is provided, the carrier 102 may be a glass carrier or any suitable carrier for carrying a semiconductor wafer or a reconstituted wafer for the manufacturing method of the semiconductor package. In some embodiments, the buffer layer 104 includes a debond layer and the material of the debond layer may be any material suitable for bonding and debonding the carrier 102 from the above layers or wafer disposed thereon. In some embodiments, the buffer layer 104 includes, for example, a light-to-heat conversion ("LTHC") layer, and such layer enables room temperature debonding from the carrier by applying laser irradiation. In some embodiments, the buffer layer 104 includes a dielectric material layer made of a dielectric material including benzocyclobutene ("BCB"), polybenzooxazole ("PBO"), or any other suitable polymer-based dielectric material.

The sub-package 110 is provided. In some embodiments, the sub-package 110 includes at least one first die 112, a first molding layer 120 and a redistribution layer structure 122. In some embodiments, the first die 112 is a memory chip such as a dynamic random access memory (DRAM) or any other suitable chip. In some embodiments, the first die 112 is disposed on the redistribution layer structure 122, for example, through an adhesive layer 118 and electrically connected to the redistribution layer structure 122 through contacts 114 and bonding wires 116. The contacts 114 may be pads or pillars on the pads, for example. The first die 112 and the bonding wires 116 are encapsulated by the first molding layer 120 on the redistribution layer structure 122, for example. In some embodiments, the redistribution layer structure 122 includes a dielectric layer 122A and a redistribution layer 122B in the dielectric layer 122A. In some embodiments, the dielectric layer 122A includes a photosensitive material such as polybenzoxazole (PBO), polyimide (PI), benzocyclobutene (BCB), a combination thereof or the like. In some embodiments, the redistribution layer 122B includes copper, nickel, titanium, a combination thereof or the like, and is formed by an electroplating process. In some alternative embodiments, the redistribution layer structure 122 is a wiring structure of a circuit substrate, and the circuit substrate may be made of fiberglass, BT (bismaleimide triazine) resin or glass-fiber-reinforced epoxy (FR4), for example. In some alternative embodiments, the first die 112 may be flip-chip bonded to the redistribution layer structure 122. The number of the first dies 112 is not limited by the disclosure.

Then, the sub-package 110 is turned upside down and placed on the carrier 102. In some embodiments, an adhesive layer 124 such as a die attach film is further formed between the carrier 102 and the sub-package 110 for better attachment, and the backside of the sub-package 110 is adhered to the carrier 102. In some embodiments, the adhesive layer 124 is disposed between the first molding layer 120 and the buffer layer 104. In some embodiments, the adhesive layer 124 is formed on an entire surface of the buffer layer 104, for example. In some alternative embodiments, the adhesive layer 124 may be only formed on the backside of the sub-package 110, that is, portions of the buffer layer 104 are exposed after adhering the sub-package 110 onto the buffer layer 104.

Figure 1B:
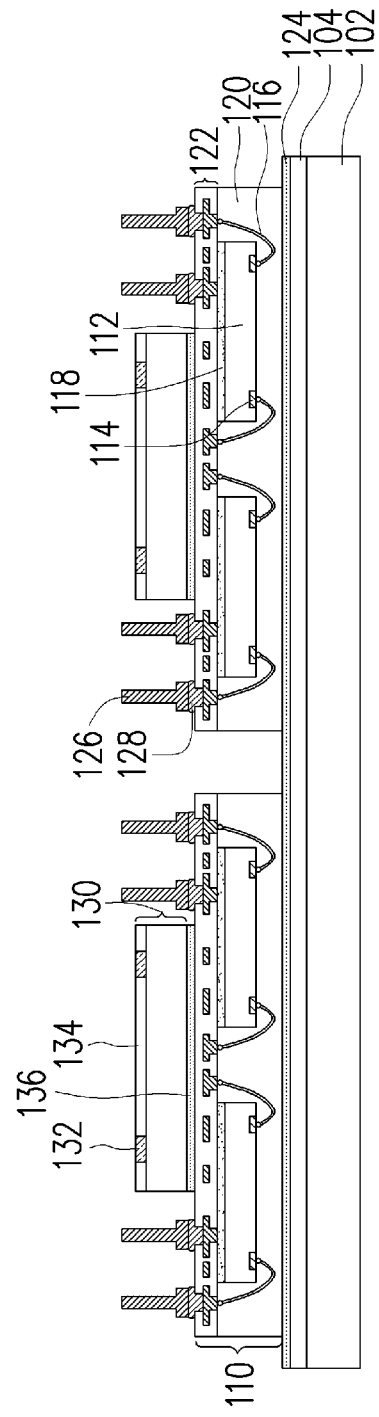

Referring to FIG. 1B, through interlayer vias (TIVs) 126 and a second die 130 are formed on the redistribution layer structure 122 of the sub-package 110. In some embodiments, the TIVs 126 may be formed by bonding to the redistribution layer structure 122 through solders 128. In detail, portions of the dielectric layer 122A is removed to form openings, and the solders 128 is formed in the openings. Then, the TIVs 126 are bonded to the solders 128, thereby fixing onto the redistribution layer structure 122. In some alternative embodiments, the TIVs 126 may be directly forming onto the redistribution layer structure 122 by plating. The second die 130 is disposed between the TIVs 126 on the redistribution layer structure 122. In some embodiments, the second die 130 is formed after forming the TIVs 126, for example. In some embodiments, the second die 130 may be a logic chip, a digital chip, an analog chip or a mixed signal chip, such as an application processor chip, an application-specific integrated circuit ("ASIC") chip, a high bandwidth memory (HBM) chip, a sensor chip, a wireless and radio frequency (RF) chip, a memory chip, a logic chip or a voltage regulator chip. In some embodiments, the second die 130 includes contacts 132. In some embodiments, the contacts 132 are pads or pillars on an active surface (not shown) and disposed in a dielectric layer 134. In some embodiments, the second die 130 is placed on the redistribution layer structure 122 through an adhesive layer 136 such as a die attach film. The adhesive layer 136 is in direct contact with the redistribution layer structure 122, for example.

Referring to FIG. 1C, in some embodiments, a second molding layer 138 is formed over the carrier 102, and the sub-package 110 on the buffer layer 104 and the second die 130 and the TIVs 126 located over the sub-package 110 are molded in the second molding layer 138. In some embodiments, the second molding layer 138 covers the buffer layer 104 and fills between the second die 130 and the TIVs 126. A material of the second molding layer 138 may be the same or different from a material of the first molding layer 120, and may include a molding compound such as epoxy or other suitable materials. In some embodiments, the second molding layer 138 surrounds the sidewall of the first molding layer 120 is in direct contact with the first molding layer 120.

Referring to FIG. 1D, in some embodiments, a planarization process is performed on surfaces of the second die 130, the TIVs 126 and the second molding layer 138, and surfaces of the second die 130, the TIVs 126 and the second molding layer 138 are substantially coplanar. In some embodiments, top surfaces of the contacts 132 and the dielectric layer 134 are exposed.

Figure 1E:
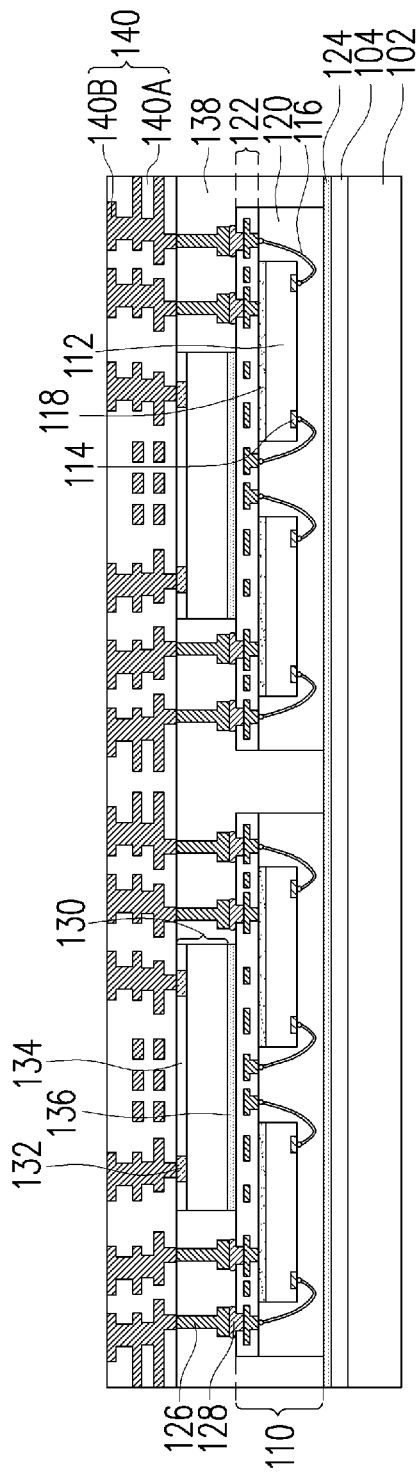

Referring to FIG. 1E, in some embodiments, a redistribution layer structure 140 is formed over the second molding layer 138, the vias 138 of the second die 130 and the TIVs 126. In some embodiment, the redistribution layer structure 140 is electrically connected to the vias 138 of the second die 130 and the TIVs 126. In some embodiments, the redistribution layer structure 140 includes a dielectric layer 140A and a redistribution layer 140B in the dielectric layer 140A. Specifically, the redistribution layer 140B is electrically connected to the vias 138 and the TIVs 126.

Figure 1F:
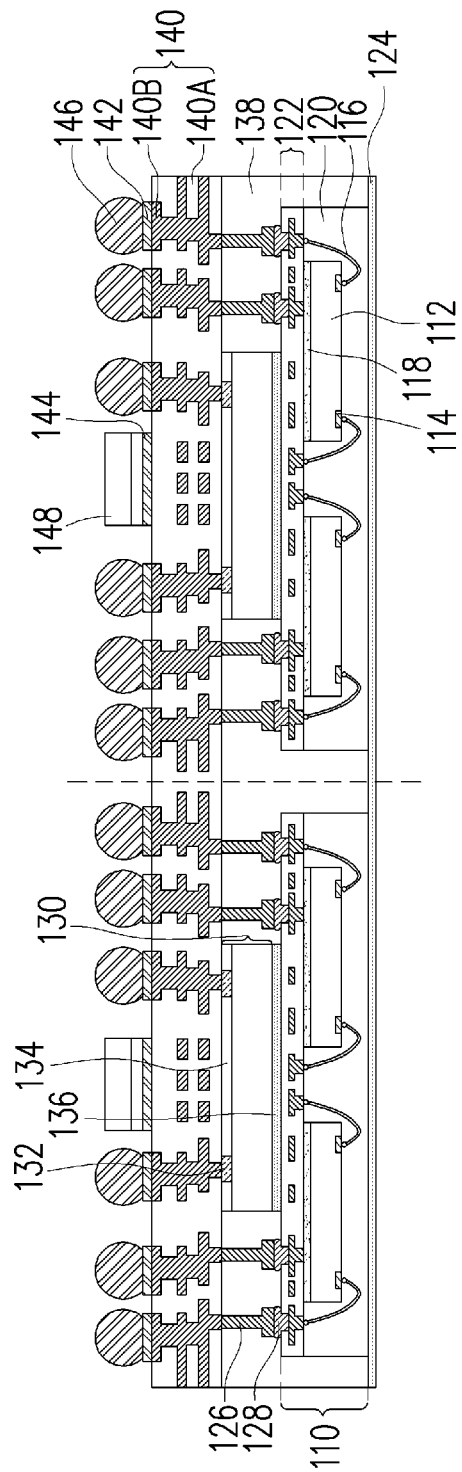

Referring to FIG. 1F, in some embodiments, the whole package is debonded from the carrier 102 to separate the sub-package 110 from the carrier 102. In some embodiments, after debonding from the carrier 102, the buffer layer 104 remained on the whole package is removed through an etching process or a cleaning process. In some alternative embodiments, the adhesive layer 124 may be entirely or partially removed. In some embodiments, the whole package includes a plurality of first sub-packages 100. In some embodiments, as shown in FIG. 1F, the dotted line represents the cutting line of the whole package in the subsequent cutting process and edge of sub-packages 110 are arranged close to but not on the cutting line.

In some embodiments, a plurality of under-ball metallurgy (UBM) pads 142 for ball mount and/or at least one connection pad 144 for mounting of passive components are formed. In some embodiments, each of the UBM pads 142 and the connection pad 144 includes copper, nickel, titanium, a combination thereof or the like, and is formed by an electroplating process. Thereafter, a plurality of conductive terminals 146 is placed on the under-ball metallurgy patterns 142, and at least one passive component 148 is mounted on the connection pads 144. In some embodiments, the conductive terminals 146 may be placed on the under-ball metallurgy patterns 142 through a ball placement process or other suitable processes and the passive components 148 may be mounted on the connection pads 144 through a soldering process, a reflowing process, or other suitable processes. In some embodiments, the passive component 148 is a capacitor, an inductor, a resistor, or another type of passive device.

Figure 1G:
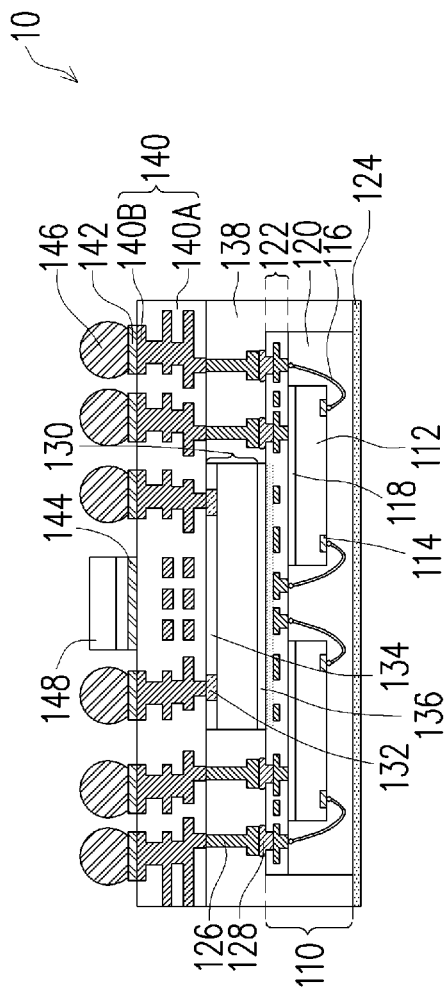

Referring to FIGS. 1F and 1G, in some embodiments, a dicing process is performed to cut the whole package structure (at least cutting though the second molding layer 138 and the redistribution layer structure 140) along the cutting line (the dotted line) into individual and separated semiconductor packages 10, as shown in FIG. 1G. In one embodiment, the dicing process is performed by mechanical blade sawing or laser cutting, for example.

Figure 1H:
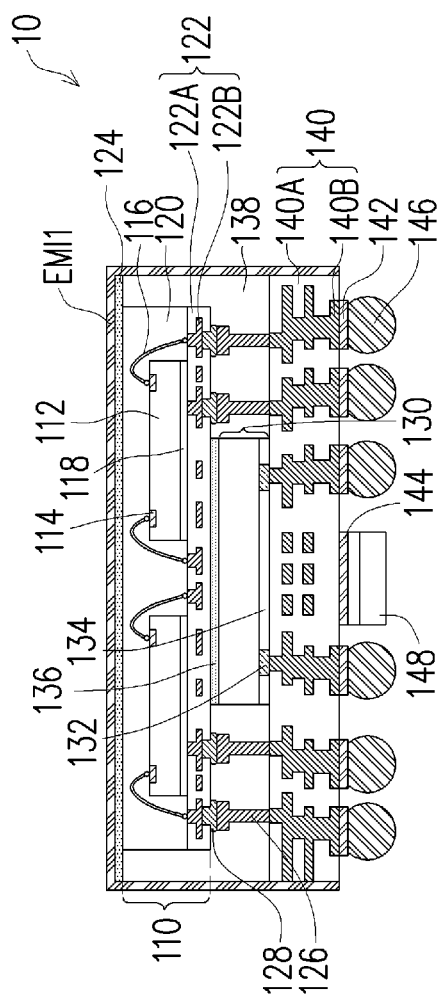

Referring to FIG. 1H, in some embodiments, the whole package is turned upside down, and then an electromagnetic interference shielding layer EMI1 is formed to cover outer surfaces or exposed surfaces of the semiconductor package 10. The electromagnetic interference shielding layer EMU is configured to reduce or prevent the emission of electromagnetic waves and therefore mitigate noise and/or malfunction of the device. In some embodiments, the electromagnetic interference shielding layer EMU is formed to cover the top and sidewall of the semiconductor package 10 and is electrically connected to the redistribution layer structure 140. In some embodiments, the electromagnetic interference shielding layer EMU is conformally formed over a surface of the adhesive layer 124 and sidewalls of the second molding layer 138 and the redistribution layer structure 140. In some embodiments, the electromagnetic interference shielding layer EMU includes aluminum, aluminum alloy, copper, copper alloy, titanium, titanium nitride, tantalum, tantalum nitride, tungsten, metal silicide, a combination thereof or the like, and is formed by a sputtering or a suitable technique. In some embodiments, the electromagnetic interference shielding layer EMU is merely over the exposed tops and sidewalls of the semiconductor package 10, without extending below the semiconductor package 10. In some alternative embodiments, the electromagnetic interference shielding layer EMI1 may further extend around the bottom corner of the semiconductor package 10 and along the surface of the redistribution layer structure 140. In some embodiments, the semiconductor package 10 may be stack with other electronic devices such as an integrated fan-out ("InFO") package, a memory device, a ball grid array (BGA), or a wafer.

In some embodiments, the second die and the sub-package including the first die are integrated through an InFO process, and the second die is directly stacked on the redistribution layer structure of the sub-package including the first die. In other words, there is no connectors such as BGA or underfill between the second die and the sub-package. Therefore, a standoff height for the BGA is not required, and a total thickness of the semiconductor package is significantly decreased. Furthermore, the thermal performance for the first or second die is improved since the interface between the first or second die with other component is decreased, and the electrical performance is improved since the electrical path to circuit such as printed circuit board is shorten. In addition, the process for manufacturing the semiconductor package is simplified, and the cost and time for manufacturing the semiconductor package may be lowered.

Figure 2:
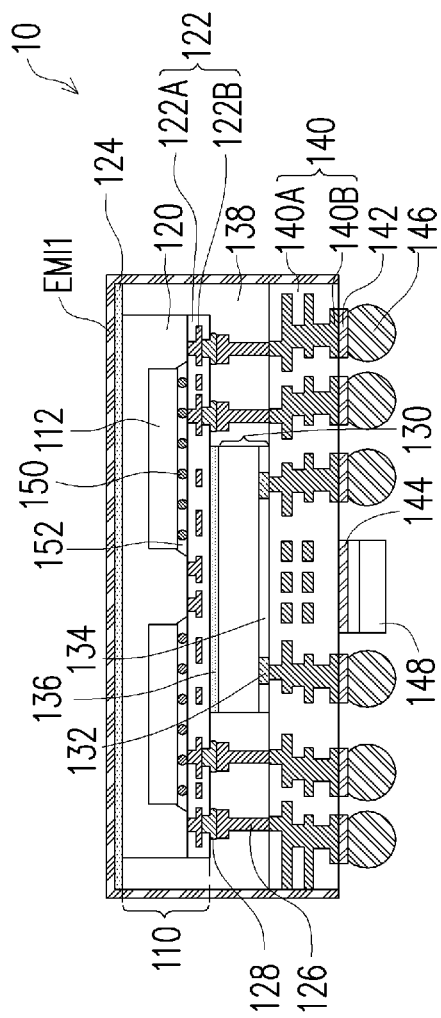
FIG. 2 is a schematic cross sectional view illustrating a semiconductor package in accordance with some embodiments.

FIG. 2 is a schematic cross sectional view illustrating a semiconductor package in accordance with some embodiments. The difference between the semiconductor package of FIG. 2 and the semiconductor package of FIG. 1H lies in the bonding type of the first die. The difference is illustrated in details below, and the similarity is not iterated herein. In FIG. 2, the first die 112 is flip-chip bonded to the redistribution layer structure 122 through connectors 150 such as bumps or balls. In some embodiments, an underfill 152 fills between the connectors 150 and the redistribution layer structure 122, for example.

Figure 3:
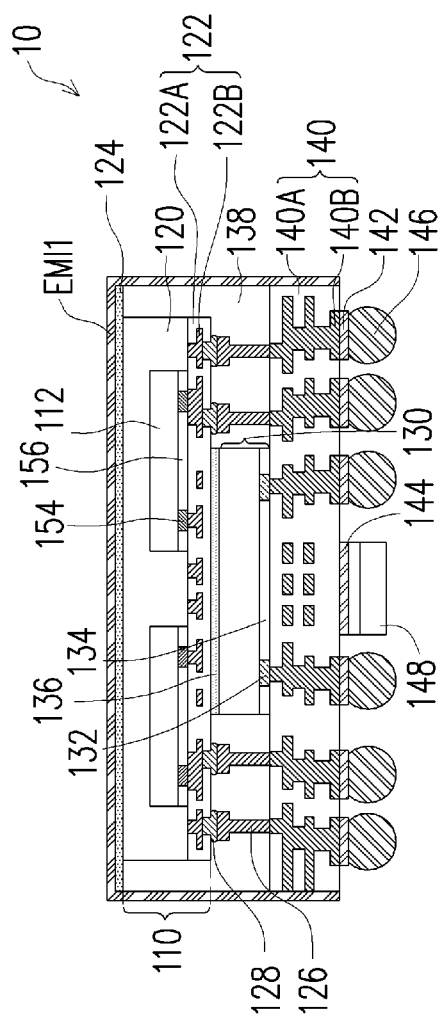
FIG. 3 is a schematic cross sectional view illustrating a semiconductor package in accordance with some embodiments.

FIG. 3 is a schematic cross sectional view illustrating a semiconductor package in accordance with some embodiments. The difference between the semiconductor package of FIG. 3 and the semiconductor package of FIG. 1H lies in the bonding type of the first die. The difference is illustrated in details below, and the similarity is not iterated herein. In FIG. 3, the first die 112 is bonded to the redistribution layer structure 122 through contacts 154 in a dielectric layer 156. The contacts 154 may be a pad or a pillar on the pad, for example.

Figure 4:
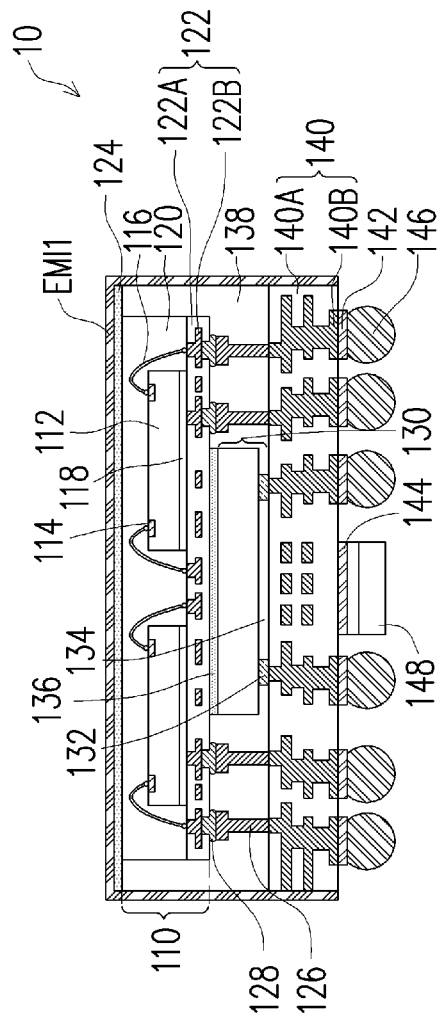
FIG. 4 is a schematic cross sectional view illustrating a semiconductor package in accordance with some embodiments.

FIG. 4 is a schematic cross sectional view illustrating a semiconductor package in accordance with some embodiments. The difference between the semiconductor package of FIG. 4 and the semiconductor package of FIG. 1H lies in that the contacts of the second die is exposed. The difference is illustrated in details below, and the similarity is not iterated herein. In FIG. 4, the second die 130 is bonded to the redistribution layer structure 122 through the contacts 132, and the contacts 132 are molded by the second molding layer 138. In other words, the dielectric layer 134 illustrated in FIG. 1H may be omitted.

Figure 5:
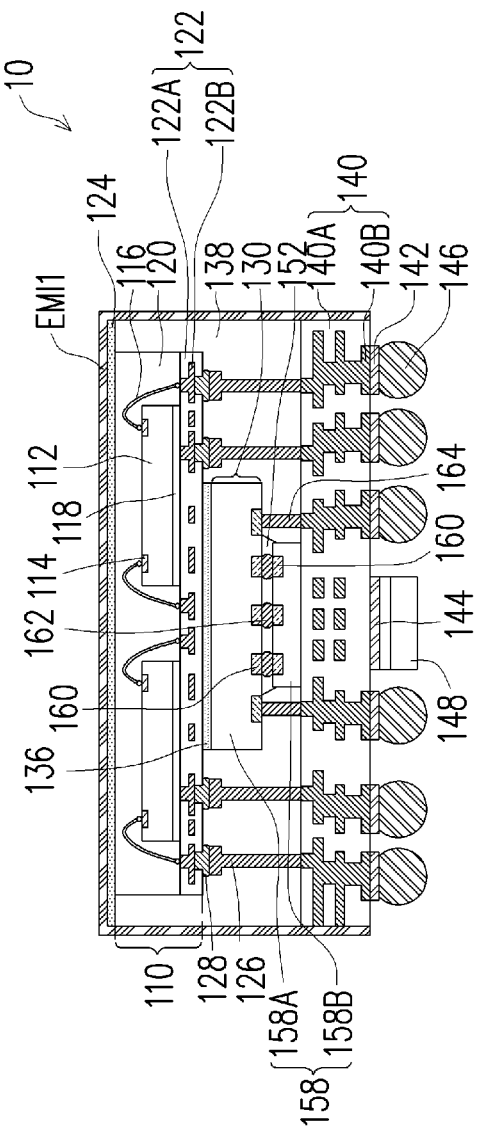
FIG. 5 is a schematic cross sectional view illustrating a semiconductor package in accordance with some embodiments.

FIG. 5 is a schematic cross sectional view illustrating a semiconductor package in accordance with some embodiments. The difference between the semiconductor package of FIG. 5 and the semiconductor package of FIG. 1H lies in the second die is replaced with a die stack. The difference is illustrated in details below, and the similarity is not iterated herein. In FIG. 5, a die stack 158 is disposed over the sub-package 110 and includes dies 158A, 158B. The dies 158A, 158B may be stacked in a face to face configuration. In some embodiments, contacts 160 of the die 158B are bonded to contacts 160 of the die 158A through connectors 162. In some embodiments, the contacts 160 are pads or pillars on the pads, for example. The connectors 162 are bumps or balls, and an underfill 152 fills between the die 152, the die 158 and the connectors 162, for example. In some embodiments, pillars 164 are formed aside the die 158B to electrically connect the die 158A to the redistribution layer structure 140.

Figure 6:
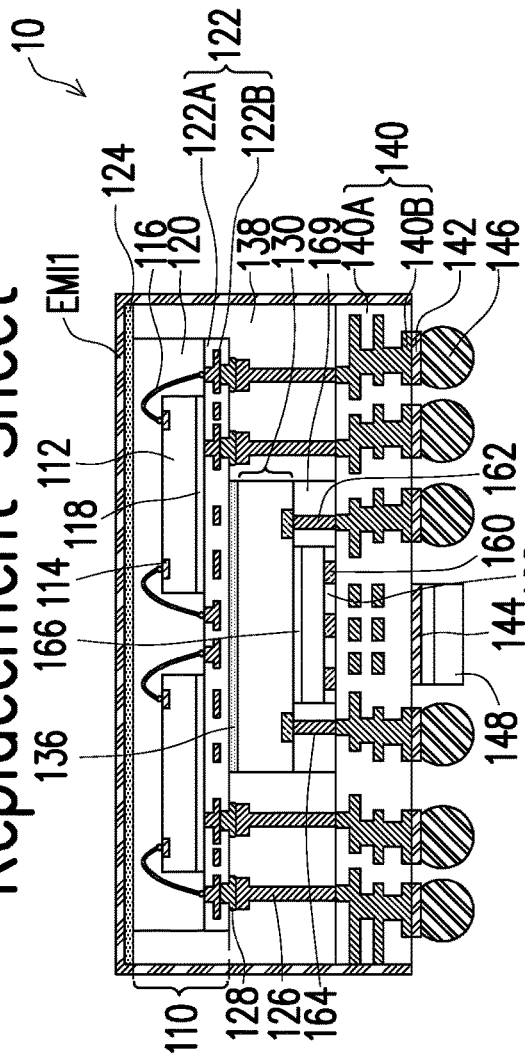
FIG. 6 is a schematic cross sectional view illustrating a semiconductor package in accordance with some embodiments.

In some alternative embodiments, as shown in FIG. 6, the dies 158A, 158B may be stacked in a face to back configuration. In this embodiment, the backside of the die 158B is adhered to the frontside of the die 158A through an adhesive layer 166 such as a die attach film. In this embodiment, the contacts 160 in a dielectric layer of 168 the die 158B are electrically connected to the redistribution layer structure 140. In this embodiment, the pillars 164 and the die 158B may be molded by a molding layer 169, for example.

Figure 7:
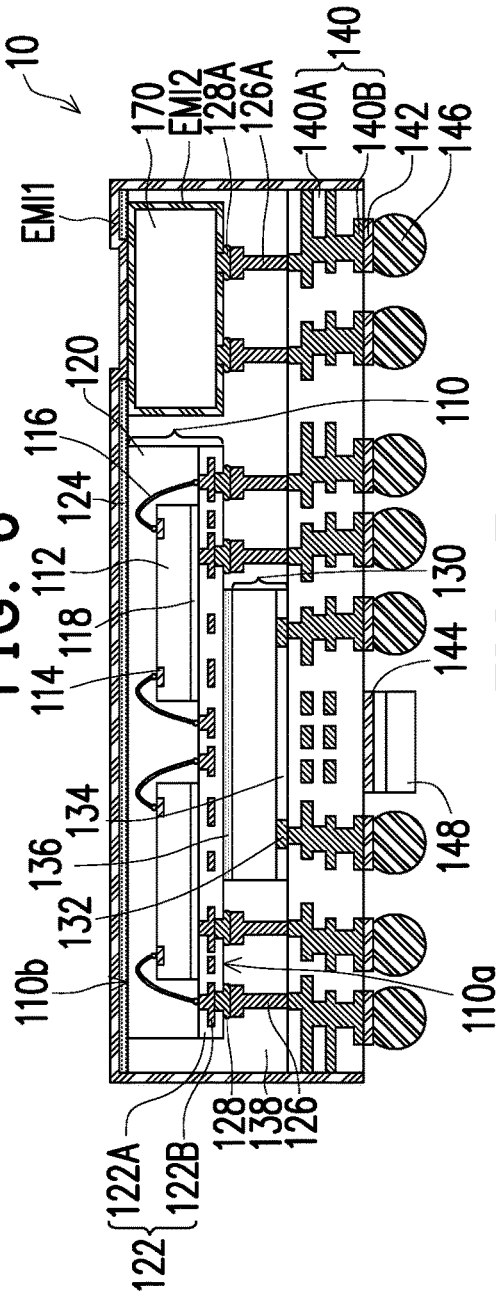
FIG. 7 is a schematic cross sectional view illustrating a semiconductor package in accordance with some embodiments.

FIG. 7 is a schematic cross sectional view illustrating a semiconductor package in accordance with some embodiments. The difference between the semiconductor package of FIG. 7 and the semiconductor package of FIG. 1H lies in that a third die is further molded with the sub-package and the second die. The difference is illustrated in details below, and the similarity is not iterated herein. In FIG. 7, a semiconductor package 10 includes the sub-package 110, the second die 130 and a third die 170 molded by the second molding layer 138 over the redistribution layer structure 140. In some embodiments, the third die 170 is disposed aside the sub-package 110, and electrically connected to the redistribution layer structure 140 through TIVs 126A. In some embodiments, the TIVs 126A surround the second die 130, and the TIVs 126A may be bonded to the third die 170 through solders 128A. In some embodiments, the third die 170 is formed with an electromagnetic interference shielding layer EMI2, and the electromagnetic interference shielding layer EMI2 covers an outer surface of the third die 170. In some embodiments, the third die 170 is a processor chip, an RF chip, an RFIC chip, an integrated passive device (IPD) chip, or a memory chip. In some embodiments, the third die 170 is a device die that are designed for mobile applications, and may include a Power Management Integrated Circuit (PMIC) die and a Transceiver (TRX) die, for example. As shown in FIG. 7, the second die 130 is disposed over a first surface 110a of the sub-package 110, and the electromagnetic interference shielding layer EMI1 covers a second surface 110b of the sub-package 110 opposite to the first surface 110a.

In some embodiments, the electromagnetic interference shielding layer EMU covers an outer surface of the semiconductor package 10. In some embodiments, a portion of the electromagnetic interference shielding layer EMI2 of the third die 170 is exposed by the adhesive layer 124, and the electromagnetic interference shielding layer EMI1 is in direct contact with the electromagnetic interference shielding layer EMI2 of the third die 170 through the adhesive layer 124. Therefore, a thermal path for heat spreading is also provided. In addition, the electromagnetic interference shielding layer EMI2 may be connected to the electromagnetic interference shielding layer EMU through the solders 128A, the TIVs 126A and the redistribution layer structure 140. It is noted that in some alternative embodiments, the adhesive layer 124 may be only formed on backsides of the sub-package 110 and the third die 170. In addition, in some alternative embodiments, the adhesive layer 124 may be removed.

Figure 8:
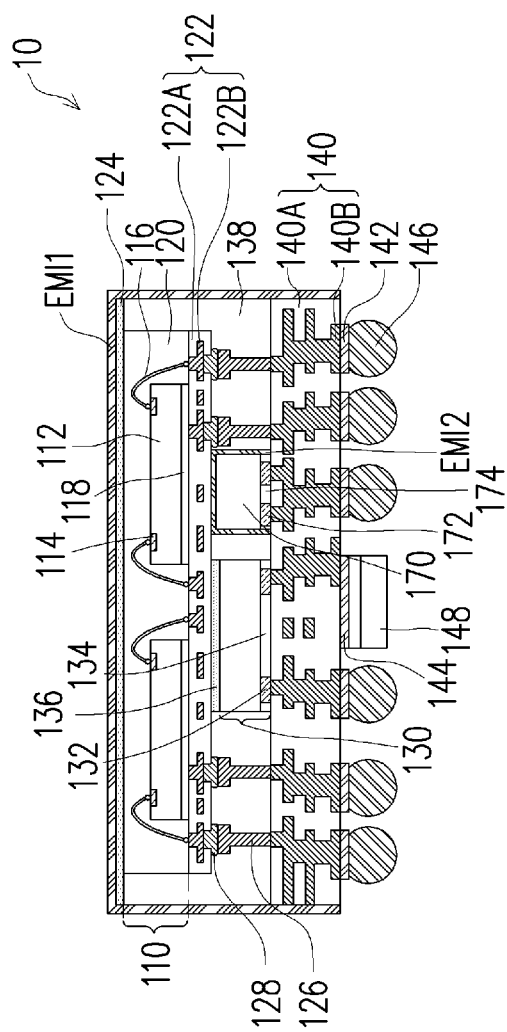
FIG. 8 is a schematic cross sectional view illustrating a semiconductor package in accordance with some embodiments.

FIG. 8 is a schematic cross sectional view illustrating a semiconductor package in accordance with some embodiments. The difference between the semiconductor package of FIG. 8 and the semiconductor package of FIG. 7 lies in that the third die having a smaller size. In FIG. 8, the third die 170 may be disposed aside the second die 130 over the redistribution layer structure 122 of the sub-package 110. In some embodiments, the third die 170 is disposed on the redistribution layer structure 122 through an adhesive layer (not shown) such as a die attach film. The second die 130 and the third die 170 are stacked on the first die 112 of the sub-package 110, and the sub-package 110, the second die 130 and the third die 170 are molded by the second molding layer 138. In some embodiments, the third die 170 includes contacts 172 in a dielectric layer 174, and the contacts 172 are electrically connected to the redistribution layer structure 140. In some embodiments, the electromagnetic interference shielding layer EMI2 is electrically connected to the electromagnetic interference shielding layer EMI1 through the contacts 172 and the redistribution layer structure 140, for example.

In some embodiments, the first die and the second die are disposed on opposite sides of the redistribution layer structure of the sub-package including the first die. In addition, a third die may be disposed aside the sub-package, or disposed aside or stacked on the second die. In other words, the second die may be disposed aside, over or below the third die. In some embodiments, the third die may be located according to its function or its and/or size of the second die. For example, the third die and the sub-package may be disposed in a horizontal side-by-side relation when the second die and the third die have larger sizes respectively or the third die has RF-related function. On contrary, the third die and the second die may be disposed in a horizontal side-by-side relation or stacked relation when the second die and the third die have smaller sizes respectively or the third die does not have RF-related function. In addition, there is no connectors such as BGA or underfill between the second die and the sub-package. Therefore, thickness and size of the package may be significantly reduced. Accordingly, the thermal performance and the electrical performance may be improved.

According to some embodiments, a semiconductor package includes a sub-package, a second die and a second molding layer. The sub-package includes a first die, a first molding layer aside the first die and a first redistribution layer structure disposed over the first die and the first molding layer and electrically connected to the first die. The second die is disposed over the sub-package, wherein the first die and the second die are disposed on opposite surfaces of the first redistribution layer structure. The second molding layer encapsulates the sub-package and the second die.

According to some embodiments, a semiconductor package includes a sub-package, a second die, a third die, a second molding layer, a second redistribution layer structure and a second electromagnetic interference shielding layer. The sub-package includes a first die, a first molding layer aside the first die and a first redistribution layer structure disposed over the first die and the first molding layer and electrically connected to the first die. The second die is disposed over a first surface of the sub-package. The third die is disposed aside the sub-package and includes a first electromagnetic interference shielding layer covering thereover. The second molding layer encapsulates the sub-package, the second die and the third die. The second redistribution layer structure is disposed over the sub-package, the second die, the third die and the second molding layer, wherein the second redistribution layer structure is electrically connected to the first die, the second die and the third die. The second electromagnetic interference shielding layer covers a second surface of the sub-package opposite to the first surface and sidewalls of the second molding material and the second redistribution layer structure.

According to some embodiments, a method of forming a semiconductor package includes the following steps. A sub-package is provided, wherein the sub-package includes a first die, a first molding layer aside the first die and a first redistribution layer structure disposed over the first die and the first molding layer and electrically connected to the first die. A plurality of through vias and a second die are formed between the plurality of through vias over the first redistribution layer structure. A second molding layer is formed to encapsulate the sub-package, the plurality of through vias and the second die. A second redistribution layer structure is formed over the second die and the plurality of through vias.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a sub-package, comprising a first die, a first molding layer aside the first die and a first redistribution layer structure disposed over the first die and the first molding layer and electrically connected to the first die;
   a second die disposed aside the sub-package;
   a first electromagnetic interference shielding layer, wherein the first electromagnetic interference shielding layer is continuous on and in physical and direct contact with all sides of the second die;
   a second molding layer, encapsulating the sub-package and the second die;
   a second electromagnetic interference shielding layer covering the sub-package and the second molding layer; and
   a first adhesive layer between the second die and the second electromagnetic interference shielding layer, wherein a first portion of the first electromagnetic interference shielding layer on a top surface of the second die is in physical and direct contact with the first adhesive layer, and a second portion of the first electromagnetic interference shielding layer on the top surface of the second die is in physical and direct contact with the second electromagnetic interference shielding layer.

2. The semiconductor package as claimed in claim 1, further comprising a plurality of through vias and an additional die over the sub-package, wherein the second molding layer encapsulates the plurality of through vias and the additional die.

3. The semiconductor package as claimed in claim 2, further comprising a second adhesive layer disposed between the additional die and the first redistribution layer structure and in direct contact with the first redistribution layer structure.

4. The semiconductor package as claimed in claim 2, further comprising a second adhesive layer over the sub-package, wherein the sub-package is disposed between the additional die and the second adhesive layer.

5. The semiconductor package as claimed in claim 1, further comprising a second redistribution layer structure over the second molding layer and electrically connected to the second die and the first redistribution layer structure.

6. The semiconductor package as claimed in claim 1, wherein the second electromagnetic interference shielding layer is electrically connected to at least one of the first die and the second die.

7. The semiconductor package as claimed in claim 1, wherein a surface of the first electromagnetic interference shielding layer is substantially coplanar with a surface of the first redistribution layer structure.

8. A semiconductor package, comprising:
a sub-package, comprising a first die, a first molding layer aside the first die and a first redistribution layer structure disposed over the first die and the first molding layer and electrically connected to the first die;
a second die, disposed aside the sub-package and comprising a first electromagnetic interference shielding layer covering thereover;
a second molding layer, encapsulating the sub-package and the second die;
a second electromagnetic interference shielding layer covering the sub-package and the second molding layer; and
a first adhesive layer, wherein a surface of the sub-package, a surface of the second molding layer and a surface of the first electromagnetic interference shielding layer on a top surface of the second die are substantially coplanar with each other and are in physical and direct contact with the first adhesive layer, wherein a first portion of the first electromagnetic interference shielding layer on the top surface of the second die is in physical and direct contact with the first adhesive layer, and a second portion of the first electromagnetic interference shielding layer on the top surface of the second die is in physical and direct contact with the second electromagnetic interference shielding layer.

9. The semiconductor package as claimed in claim 8, wherein the second molding layer is in direct contact with the first molding layer.

10. The semiconductor package as claimed in claim 8, further comprising a second redistribution layer structure disposed over and electrically connected to the sub-package and the second die, wherein the second die is electrically connected to the second redistribution layer structure through at least one through via in the second molding layer.

11. The semiconductor package as claimed in claim 10, wherein the second electromagnetic interference shielding layer is in physical and direct contact with the second redistribution layer structure to electrically connect to the second redistribution layer structure.

12. The semiconductor package as claimed in claim 8, further comprising a third die, wherein the first die and the third die are disposed on opposite sides of the first redistribution layer structure.

13. The semiconductor package as claimed in claim 12, further comprising a second adhesive layer disposed between the third die and the first redistribution layer structure and in direct contact with the first redistribution layer structure.

14. The semiconductor package as claimed in claim 8, wherein the first adhesive layer is continuously disposed between the second electromagnetic interference shielding layer and the sub-package, between the second electromagnetic interference shielding layer and the second molding layer, and between the second electromagnetic interference shielding layer and the first portion of the first electromagnetic interference shielding layer on the top surface of the second die.

15. The semiconductor package as claimed in claim 8, wherein a surface of the second electromagnetic interference shielding layer is substantially coplanar with the surface of the sub-package, the surface of the second molding layer and the surface of the first electromagnetic interference shielding layer.

16. A method of forming a semiconductor package, comprising:
providing a sub-package onto a carrier through a first adhesive layer, wherein the sub-package comprises a first die, a first molding layer aside the first die and a first redistribution layer structure disposed over the first die and the first molding layer and electrically connected to the first die;
forming a second die aside the sub-package on the first adhesive layer;
forming a first electromagnetic interference shielding layer, wherein the first electromagnetic interference shielding layer is continuous on and in physical and direct contact with all sides of the second die;
forming a second molding layer to encapsulate the sub-package and the second die; and
forming a second electromagnetic interference shielding layer covering the sub-package and the second molding layer, wherein the first adhesive layer is disposed between the second die and the second electromagnetic interference shielding layer, a first portion of the first electromagnetic interference shielding layer on a top surface of the second die is in physical and direct contact with the first adhesive layer, and a second portion of the first electromagnetic interference shielding layer on the top surface of the second die is in physical and direct contact with the second electromagnetic interference shielding layer.

17. The method as claimed in claim 16, further comprising forming an additional die over the first redistribution layer structure through a second adhesive layer.

18. The method as claimed in claim 17, wherein the second adhesive layer is in direct contact with the first redistribution layer structure.

19. The method as claimed in claim 16, wherein the second electromagnetic interference shielding layer is disposed over a surface of the sub-package and sidewalls of the second molding layer.

20. The method as claimed in claim 19, wherein the second electromagnetic interference shielding layer is electrically connected to the second redistribution layer structure.

* * * * *